United States Patent
Bernard

(10) Patent No.: US 10,852,355 B2
(45) Date of Patent: Dec. 1, 2020

(54) ELECTRICAL PROTECTION APPARATUS WITH TEST BUTTON

(71) Applicant: Schneider Electric Industries SAS, Rueil-Malmaison (FR)

(72) Inventor: Jean-Baptiste Bernard, Seyssinet-Pariset (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 476 days.

(21) Appl. No.: 15/785,588

(22) Filed: Oct. 17, 2017

(65) Prior Publication Data
US 2018/0149700 A1    May 31, 2018

(30) Foreign Application Priority Data

Nov. 28, 2016  (FR) ..................... 16 61556

(51) Int. Cl.
| | |
|---|---|
| *H01H 9/54* | (2006.01) |
| *G01R 31/333* | (2006.01) |
| *H01H 83/04* | (2006.01) |
| *G01R 31/50* | (2020.01) |
| *H01H 71/12* | (2006.01) |
| *H02H 1/00* | (2006.01) |
| *H02H 3/04* | (2006.01) |

(Continued)

(52) U.S. Cl.
CPC ......... *G01R 31/3333* (2013.01); *G01R 31/50* (2020.01); *H01H 9/54* (2013.01); *H01H 71/128* (2013.01); *H01H 83/04* (2013.01); *H02H 1/0061* (2013.01); *H02H 1/0069* (2013.01); *H02H 3/04* (2013.01); *H02H 3/167* (2013.01); *H01H 2083/045* (2013.01); *H01H 2083/201* (2013.01)

(58) Field of Classification Search
USPC .................................... 361/42–50
See application file for complete search history.

(56) References Cited

U.S. PATENT DOCUMENTS

| | | | | |
|---|---|---|---|---|
| 8,081,001 | B2 * | 12/2011 | Hooper | H02H 3/335 324/424 |
| 2004/0252425 | A1 | 12/2004 | Baldwin et al. | |

(Continued)

OTHER PUBLICATIONS

French Preliminary Search Report dated Sep. 27, 2017 in French Application 16 61556, filed on Nov. 28, 2016 (with English Translation of Categories of cited documents).

*Primary Examiner* — Danny Nguyen
(74) *Attorney, Agent, or Firm* — Oblon, McClelland, Maier & Neustadt, L.L.P.

(57) ABSTRACT

An electrical protection apparatus includes at least one first or main electrical protection function able to be carried out by a microcontroller and a button termed a test button intended to be actuated by a user to give rise to the implementation of the testing of at least one second electrical function, this implementation of the test being intended to give rise to the tripping of the protection apparatus D. The electrical protection apparatus includes a device for pooling the actuation of this test button with at least one action intended to carry out a third function, as a function of various types of action exerted on the test button, these actions being detected by the microcontroller, the aim being for the latter to give the order to carry out one of the third functions or else the testing of one of the second functions.

17 Claims, 8 Drawing Sheets

(51) Int. Cl.
*H02H 3/16* (2006.01)
*H01H 83/20* (2006.01)

(56) References Cited

U.S. PATENT DOCUMENTS

| | | |
|---|---|---|
| 2008/0204947 A1 | 8/2008 | Shea et al. |
| 2009/0198459 A1* | 8/2009 | Bilac .................... H02H 1/0015 |
| | | 702/58 |
| 2010/0085206 A1* | 4/2010 | Nayak ...................... H02H 3/04 |
| | | 340/815.45 |
| 2011/0147178 A1* | 6/2011 | Larson ..................... H01H 9/16 |
| | | 200/308 |
| 2011/0221600 A1* | 9/2011 | Kinsel .................... H02H 3/335 |
| | | 340/650 |
| 2016/0141862 A1* | 5/2016 | Endozo ................... H01H 9/54 |
| | | 361/115 |

* cited by examiner

ELECTRICAL PROTECTION APPARATUS WITH TEST BUTTON

TECHNICAL FIELD

The present invention relates to an electrical protection apparatus comprising at least one so-called first or main electrical protection function able to be carried out by a microcontroller and a button termed a test button intended to be actuated by a user to give rise to the implementation of the testing of at least one so-called second electrical function, this implementation of the test being intended to give rise to the tripping of the protection apparatus.

PRIOR ART

Electrical protection apparatuses, commonly termed AFDD circuit breakers (this term being the abbreviation for 'Arc Fault Detection Device', signifying that the apparatus carries out the electric arc detection function), including a circuit breaker module associated with a module housing the electric arc detection function, which arcs may occur in faulty conductors or connections and are liable to produce significant local heat (AFDD function), are known. Some of these AFDD circuit breakers also incorporate the differential protection function.

These apparatuses have, on the front face, a button, termed a test button, making it possible, when it is pressed, to launch a test of the arc detection function or of the differential function of the apparatus. If the test is positive, tripping of the apparatus is carried out.

By virtue of the trip lever situated on the front face of the protection apparatus, it is possible to ascertain whether a trip originates from the circuit breaker or else from the AFDD module. When a trip originates from the circuit breaker, the aforementioned lever is in the tripped position, and an indicator visible through a viewing window of the AFDD module indicates a non-tripped position of the apparatus. By contrast, when a trip due to the AFDD module is involved, the lever and the indicator indicate a tripped position.

In the case of the integration of differential protection into the existing AFDD module, it is not possible to differentiate between an RCD trip cause (that is to say generated by the differential protection function, RCD being the abbreviation for 'residual current device') and an AFDD trip cause following detection of an arc, as the two functions are carried out in the same 18 mm block.

Thus, on current AFDD apparatuses, in order to recover the precise item of information on the trip cause, it is necessary to dismount the apparatus from the switchboard and to insert it on a dedicated carrier making it possible to establish communication with a computer.

Now, when a plurality of protection functions are integrated into one and the same module, it is vital to be able to define, in a simple manner, the type of fault that caused the apparatus to trip, in order to be able to launch a rapid investigation into the trip cause, and therefore to correct the latter in the electrical installation.

Ascertaining this information must be simple for the user wishing to use the apparatus (electrician, or even individual client).

DISCLOSURE OF THE INVENTION

The present invention solves these problems and provides an electrical protection apparatus equipped with a test button and decoding intelligence (a microcontroller) making it possible to add, in a simple manner, an on-demand function having added value for the user, such as the function of communicating the last trip cause of the apparatus.

To this end, the subject of the present invention is an electrical protection apparatus of the kind mentioned previously, this apparatus being characterized in that it comprises means for pooling the actuation of this test button with at least one action intended to carry out a so-called third function, as a function of various types of action exerted on the test button, these actions being detected by the microcontroller, the aim being for the latter to give the order to carry out one of the aforementioned so-called third functions or else the testing of one of the aforementioned so-called second functions.

According to one particular feature, the so-called first or main electrical function comprises the short-circuit detection function or else the electrical overload detection function.

According to another feature, the at least one so-called second function is one of the functions contained in the group comprising a differential protection function, an arc detection function, or a DC differential fault detection function, for example a type B RCD function.

According to another feature, the at least one so-called third function is one of the functions contained in the group comprising an item of information transmission action, a function for testing the differential function without tripping, and a so-called AC class test function in the case where the apparatus is a type B RCD.

According to another feature, the aforementioned item of information is the item of information on the last trip cause of the apparatus, which item of information is stored by the microcontroller.

According to another implementation, the apparatus comprising the differential protection function, the aforementioned item of information is the value of the earth leakage current seen by the differential protection.

According to another feature, the so-called first means for transmitting the aforementioned item of information comprise a so-called first LED, or else a wireless link.

According to another feature, the aforementioned LED is able to emit an encoded luminous signal, the code of which corresponds to the type of item of information to be transmitted.

According to another feature, the last trip cause is one of the causes contained in the group comprising the detection of a differential fault, the detection of a series arc, the detection of a parallel arc, the detection of a fault due to an overvoltage or of a fault originating internally from the apparatus. This fault of internal origin may thus consist of a defect in the calculating unit of the microcontroller or a corruption of the Flash memory.

According to another feature, the various types of action on the test button comprise a long press and/or a short press and/or a double short press, and/or a given number, or a combination, of the previous sequences within a given time window. For example, four double presses in less than twenty seconds.

According to another feature, the actuation of the test button by a long press has the effect of sending, by the microcontroller, an order to carry out the testing of one of the so-called second functions for a calibrated time, whereas the actuation of the test button by a double short press has the effect of carrying out at least one of the aforementioned so-called third functions. Sending this order for a calibrated time makes it possible not to needlessly stress the electronic components involved in the function.

According to another feature, the actuation of the test button by a given number of short double presses within a given temporal window sends a sequence to RESET the internal memory.

According to one particular feature, this apparatus comprises so-called second means for informing the user of the type of action exerted on the test button and detected by the microcontroller, and means for the user to acknowledge the requested action by way of a new actuation of the test button.

According to one particular feature, the so-called second information means comprise a so-called second LED able to flash after the actuation of the test button for a predetermined duration with two different flashes depending on what the microcontroller has detected, this flashing being able to be interrupted during this duration when the user actuates the aforementioned acknowledgement means.

According to one particular feature, the so-called first LED and/or the so-called second LED is/are situated on the front face of the apparatus.

According to one particular feature, this apparatus is a differential circuit breaker comprising the arc detection function.

According to another feature, this apparatus comprises a circuit breaker module associated with a differential protection module incorporating the arc detection function.

BRIEF DESCRIPTION OF THE FIGURES

However, other advantages and features of the invention will become more clearly apparent in the detailed description that follows with reference to the appended drawings which are given solely by way of example and in which:

FIG. 1 shows a so-called AFDD-RCD differential circuit breaker D according to one particular implementation of the invention, said apparatus comprising a circuit breaker module 1 associated with a so-called AFDD-RCD module 2. It will be noted that, in what follows, the addition of the term 'AFDD' signifies that the apparatus comprises the so-called 'arc detection' function, whereas the addition of the term 'RCD' signifies that the apparatus carries out the 'differential protection' function.

Figure 1:
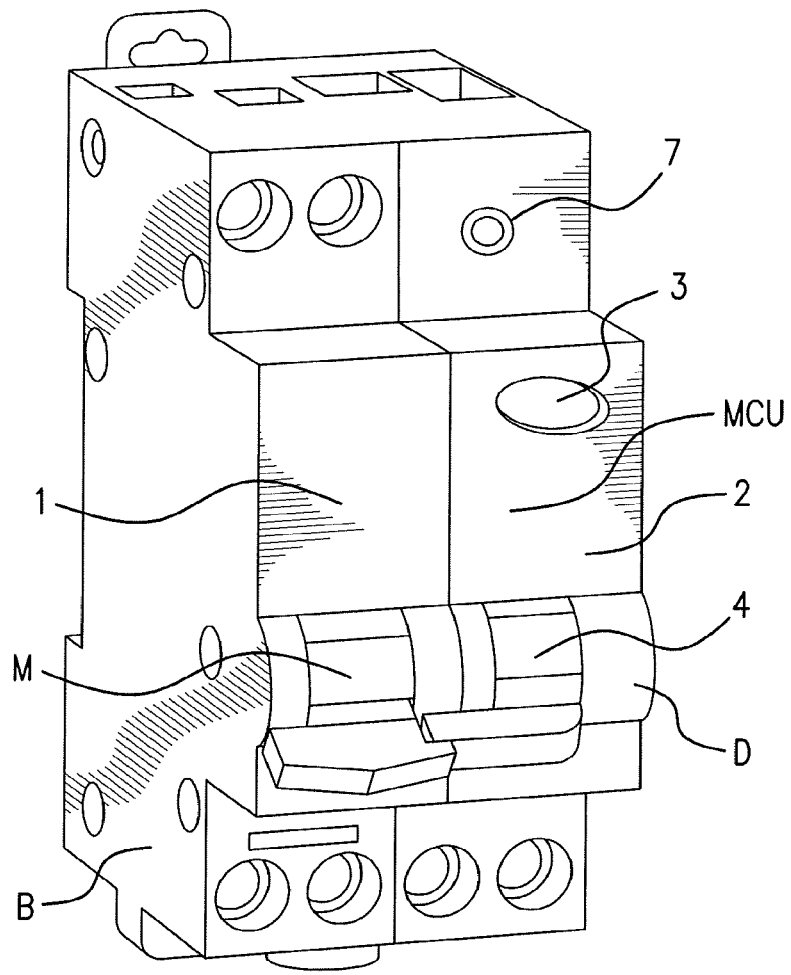
FIG. 1 is a perspective view of an AFDD-RCD differential circuit breaker according to one particular implementation of the invention.

In a manner known per se, the circuit breaker module 1 carries out the so-called first main function of electrical protection upon the occurrence of a short circuit or else of an electrical overload in the circuit to be protected, whereas the so-called AFDD-RCD module 2 carries out the so-called second function of electrical protection in the event of the occurrence of electric arcs that may arise in faulty conductors or connections, and also that of differential protection. The aforementioned main function is carried out by way of a microcontroller MCU cooperating with means for detecting the aforementioned faults, in such a way as to open the aforementioned contacts.

These two modules 1,2 are housed in a housing B in one piece or that is formed by combining two housings corresponding to the two modules MCB and AFD, respectively, the assembly comprising, on its front face, a pushbutton 3, termed test button, which is intended to be actuated for the purpose of launching a sequence for testing the arc detection function or else the differential function, or else the two functions.

This circuit breaker D comprises, on its front face, a lever M able to be displaced between a position in which the contacts of the circuit breaker D are closed and a position in which said contacts are open, the change from one position to the other being able to be carried out either manually by a user or automatically upon the occurrence of an electrical fault in the circuit to be protected. The so-called AFDD-RCD module 2 has, on its front face, a viewing window 4 able to display a medium that is coloured depending on the tripped or non-tripped state of the AFDD-RCD module.

According to the invention, this apparatus comprises means for pooling the actuation of this test button 3 with at least one action intended to carry out a so-called third function, as a function of various types of action exerted on the test button, these actions being detected by the microcontroller MCU, the aim being for the latter to give the order to carry out one of the aforementioned so-called third functions or else the testing of one of the aforementioned so-called second functions.

Thus, according to the invention, the microcontroller used to carry out the so-called main protection function is used to detect various types of action on the pushbutton, such as a long press, a short press, or a double short press, or a given number of short double presses, or else a given number of these sequences or a given combination of the previous sequences, within a given temporal window in order to launch a particular action.

According to one particular implementation, the actuation of the test button 3 (or PTT) by a long press has the effect of sending, by the microcontroller MCU, an order to carry out the testing of one of the so-called second functions, whereas the actuation of the test button 3 by a double short press has the effect of carrying out at least one of the aforementioned so-called third functions.

According to one particular implementation of the invention, the so-called second function is a differential protection function, whereas the so-called third function is the function for communicating the item of information on the last trip cause of the apparatus.

Thus, upon the actuation of the test button by a rapid double press, a transmission of the last trip cause stored by the microcontroller is transmitted to the user via an LED 7, the number of flashes of which is representative of the last trip cause of the apparatus. Upon a long press on the test button, an RCD test sequence is sent, consisting in generating a differential current in the summing torus of the differential fault detection device belonging to the AFDD RCD module.

Thus, in this implementation, there is no need to add a second button in order to obtain this item of information on the last trip cause, thereby resulting in a reduction in cost and in bulk. For an equivalent cost, a functionality having a high added value for a user is therefore added in order to investigate the fault and determine the exact cause of the trip.

Thus, on low-bulk products, and without having to rethink the entire design of the product, the invention makes it possible to use and to adapt the functionalities installed, namely the pushbutton 3 connected to the microcontroller MCU, so as to add a functionality with high added value for the user.

Figure 3A:
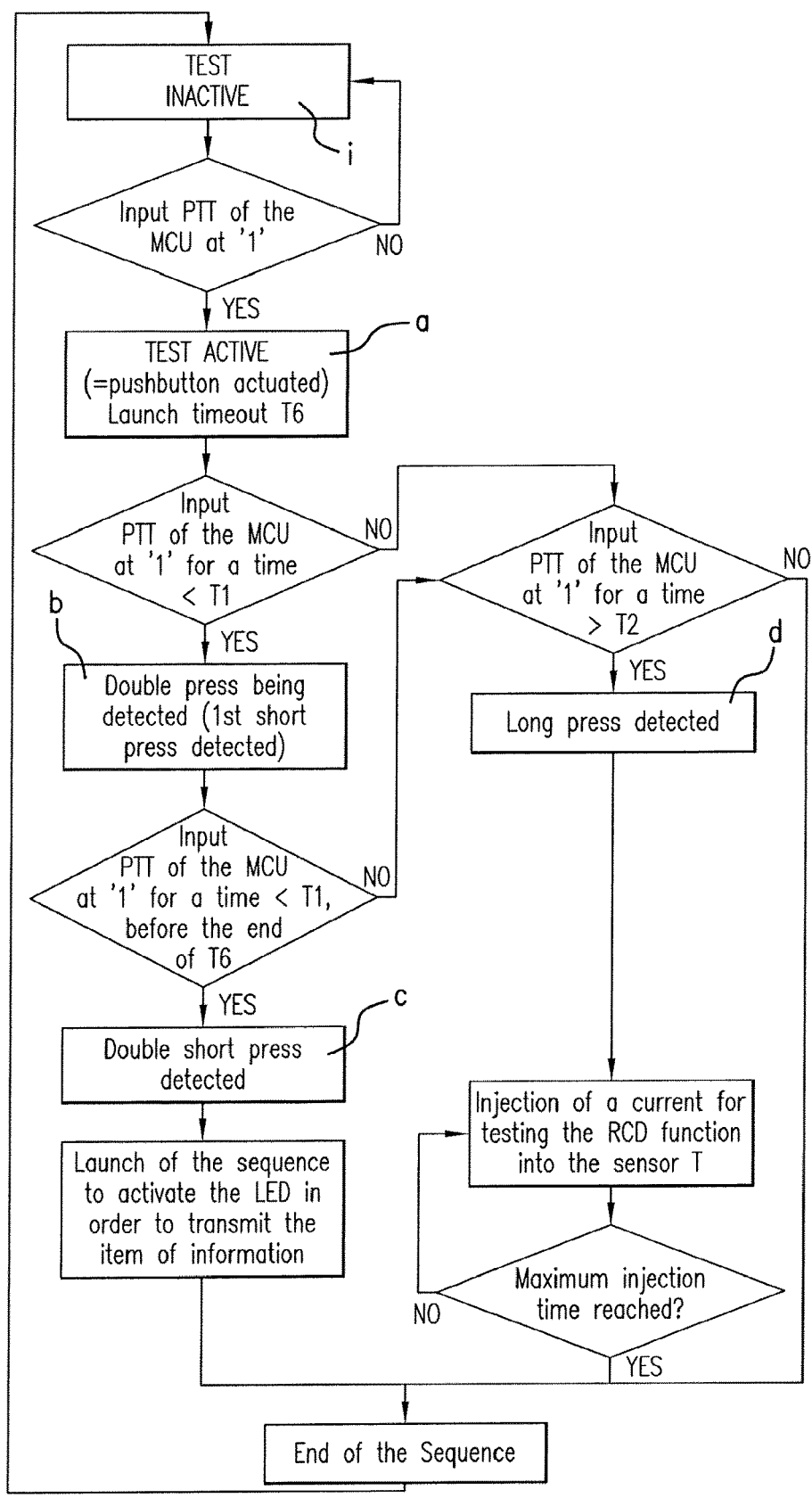
FIG. 3A is a diagram illustrating the operation of a circuit breaker according to one particular implementation of the invention.

The detailed operation of an electrical protection apparatus according to the previously described implementation will be described in what follows with reference to FIG. 3A.

Figure 2:
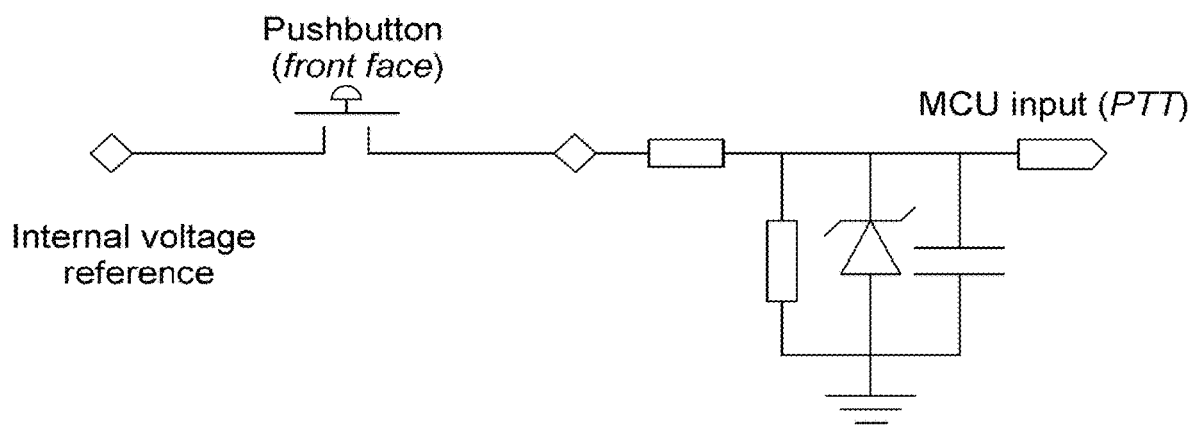
FIG. 2 is a circuit diagram illustrating the establishment of the connection according to the invention between the microcontroller of the circuit breaker or the AFDD module associated laterally therewith, on the one hand, and the test button, on the other hand.

In the inservice position of the apparatus, the pushbutton is deactivated (i). Upon a first activation at (a) of the pushbutton PTT on the front face for a duration of greater than 50 ms, a connection is established with the microcontroller MCU, enabling the latter to know that the pushbutton is pressed. The press on this button results in a high logic voltage (FIG. 2) on the input of the microcontroller MCU.

A second action is then carried out on the pushbutton.

Depending on the type of actions exerted on the pushbutton, the state machine embedded in the microcontroller makes it possible to choose one of the two actions to be performed.

When, in a first case, the user has carried out two rapid presses (b) and (c) each of a duration of between 0 and 0.5 s and separated from one another by a minimum duration of 5 s, the microcontroller, after having detected these two rapid presses, sends the order to the LED to produce a luminous signal comprising a sequence of flashes corresponding to the last type of fault that caused the apparatus to trip, the item of information on this type of fault being recorded in the microcontroller. After this, the pushbutton becomes inactive again (i).

Figure 4:
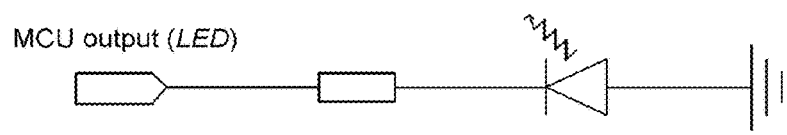
FIG. 4 is a circuit diagram illustrating the driving of an LED by the microcontroller upon the detection of two short presses on the test button by the microcontroller.

Thus, as illustrated in FIG. 4, upon the detection of two short presses (with a short duration press of less than 0.5 s and a duration between these two presses of 5 s), a sequence of flashes of the LED is launched and driven by the microcontroller. The pushbutton then becomes inactive again.

In the opposite case where the user has carried out a long press at (d) on the pushbutton of a duration of greater than 1 second, the microcontroller sends a sequence for carrying out a so-called RCD test by simulating a fault current for around 100 ms, which is sufficient to trigger the RCD protection. The pushbutton then becomes inactive again (i).

According to a third possibility, the user exerts pressure (e) for a duration of between 0.5 s and 1 s, and, in this case, the pushbutton becomes inactive again.

Thus, according to this implementation, a long activation of the pushbutton of a duration of greater than 1 s sends a test of the protection against earth leakages by positioning a resistor between the phase and the neutral.

Two short activations of the pushbutton of a duration of less than 0.5 s with a time interval of 5 s between two activations send a sequence to indicate the last item of trip information stored in the Flash memory with the following code:

1 flash: No trip cause recorded, enables the correct operation of the product to be verified.
2 flashes: trip following an earth leakage.
3 flashes: trip following the occurrence of a parallel arc.
4 flashes: trip following the occurrence of a series arc.
5 flashes: trip following an overvoltage.
6 flashes: trip following an internal fault.

The duration of activation of the LED will advantageously be 100 ms, whereas the duration of non-activity of the LED between two flashes will advantageously be 1 s.

Figure 5:
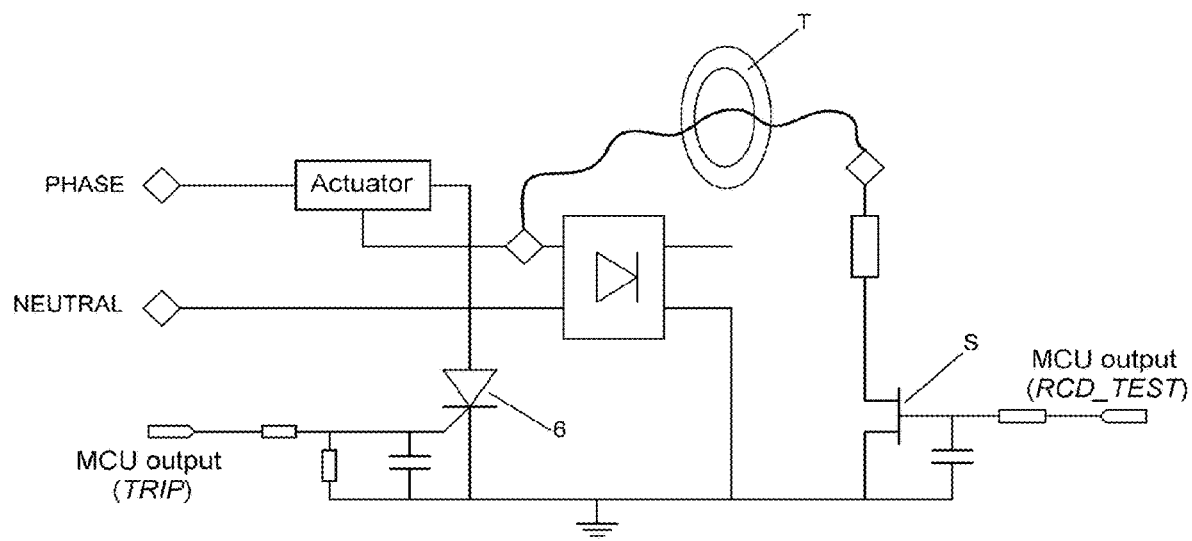
FIG. 5 is a circuit diagram illustrating a differential protection test upon the detection of a long press on the test button by the microcontroller.

As illustrated in FIG. 5, upon the detection of a long press, a normalized differential current is generated between the phase P and the neutral N in the torus T so as to trip the RCD protection.

In this particular implementation, the generation of the differential current involves an MOS transistor S, but could also involve a thyristor 6 such as for the trip circuit associated with the main protection of the apparatus driven by an output of the microcontroller (RCD TEST).

Figure 3B:
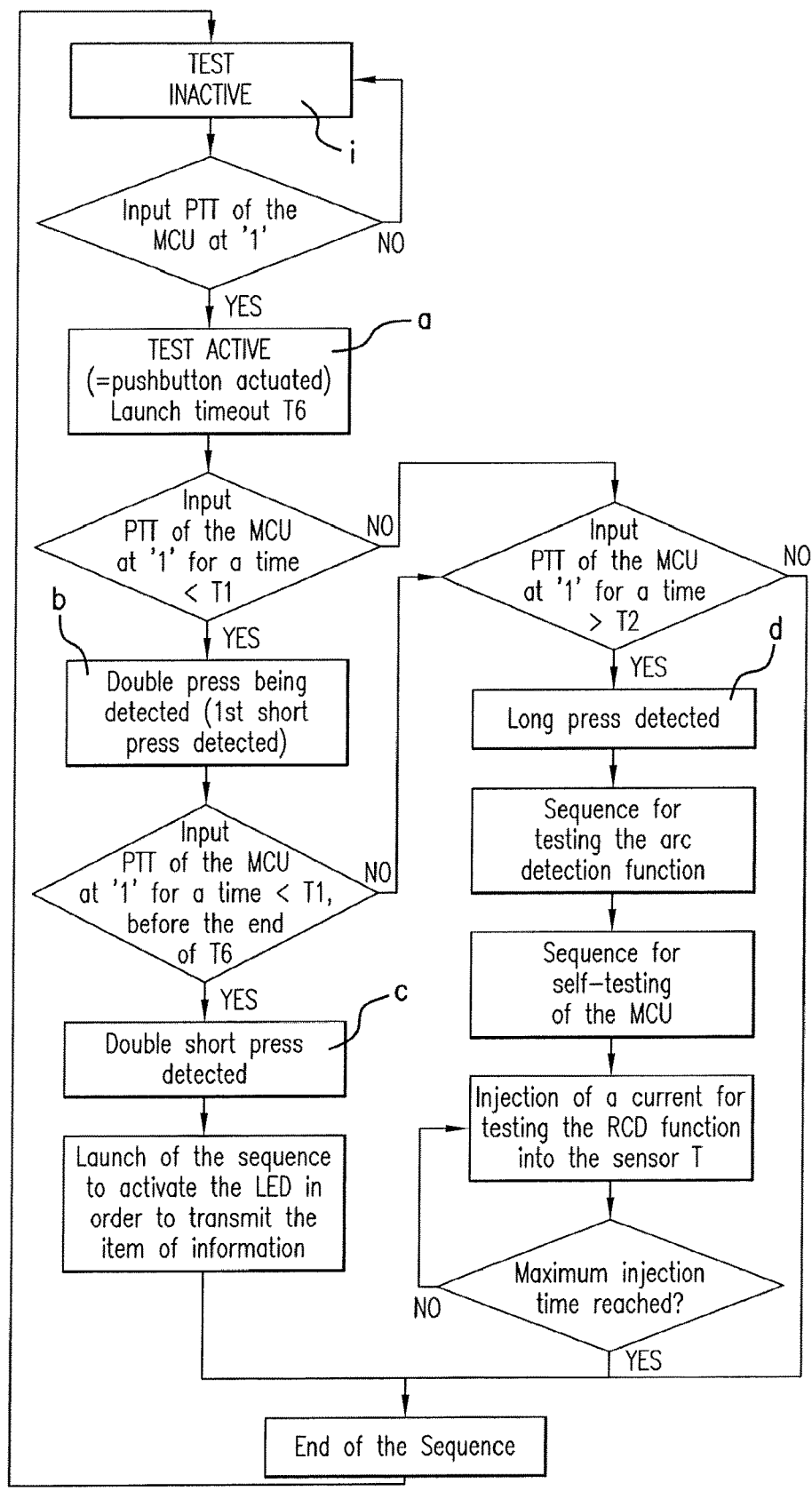
FIG. 3B is a diagram illustrating the operation of a circuit breaker according to another mode of implementation of the invention, having a greater test coverage.

According to another implementation of a circuit breaker according to the invention, the latter operates as illustrated in FIG. 3B, this mode of operation having a greater test coverage. This mode of operation is the same as that described in FIG. 3A except that, after a long press detected on the test button, and the launching of a sequence for testing the RCD function, an arc detection function test and a self-test of the MCU are carried out before the injection of a current for testing the RCD function into the sensor.

FIGS. 6, 7, 8 and 9 show timing diagrams illustrating the operation of a circuit breaker according to one particular mode of implementation of the invention in which the so-called second function of sending a sequence to activate an RCD test circuit and two so-called third functions, i.e. of sending a sequence for transmitting an item of information on the trip cause of the circuit breaker, on the one hand, and of clearing the internal memory, on the other hand, are carried out.

Figure 6:
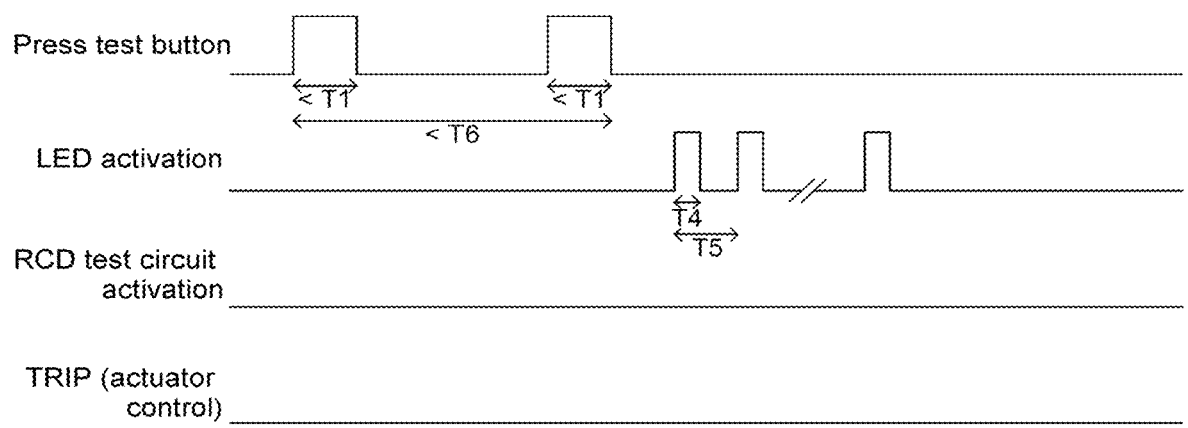
FIGS. 6 to 9 are timing diagrams illustrating the operation of an AFDD-RCD circuit breaker as a function of various types of actuation of the test button.

As illustrated in FIG. 6, the implementation of the so-called second function requires the actuation of the test button by two successive short presses each of a maximum duration T1 within a temporal window T6 (temporal window within which the two short presses have to be carried out in order to launch the sequence for transmitting the item of information). After this sequence of two short presses, the LED emits a flash of a duration T4 over a period T5 greater than T4.

Figure 7:
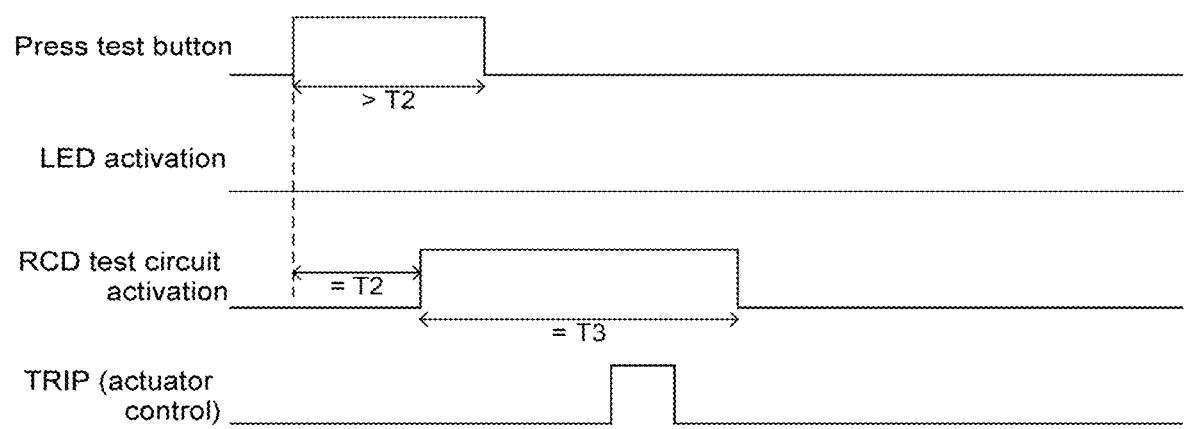

As illustrated in FIG. 7, the implementation of the so-called third function of sending the sequence to activate the test circuit requires a long press on the button of a duration greater than T2. The activation of the circuit for testing the differential protection is carried out over a duration T3, and it is seen that this activation begins during the duration of the long press, after the minimum duration T2 required for a long press. The control of the actuator, which control is intended to bring about the tripping of the apparatus, begins during the second half of this period T3.

Figure 8:
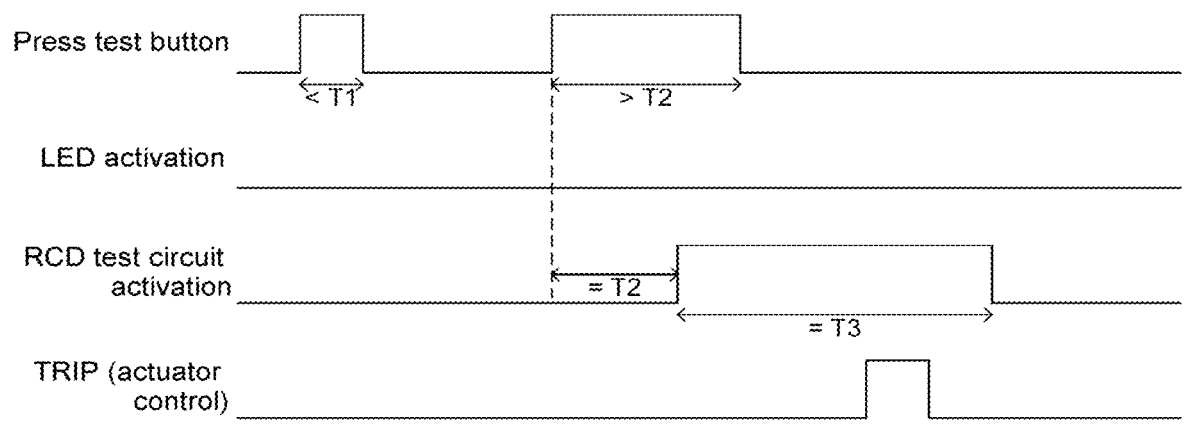

As illustrated in FIG. 8, carrying out a short press of a duration less than T1 followed by a long press of a duration greater than T2 brings about the activation of the RCD test circuit after a minimum period T2>T1 after the beginning of the aforementioned long press, and tripping of the circuit breaker in the same manner as described previously in relation to FIG. 7.

Figure 9:
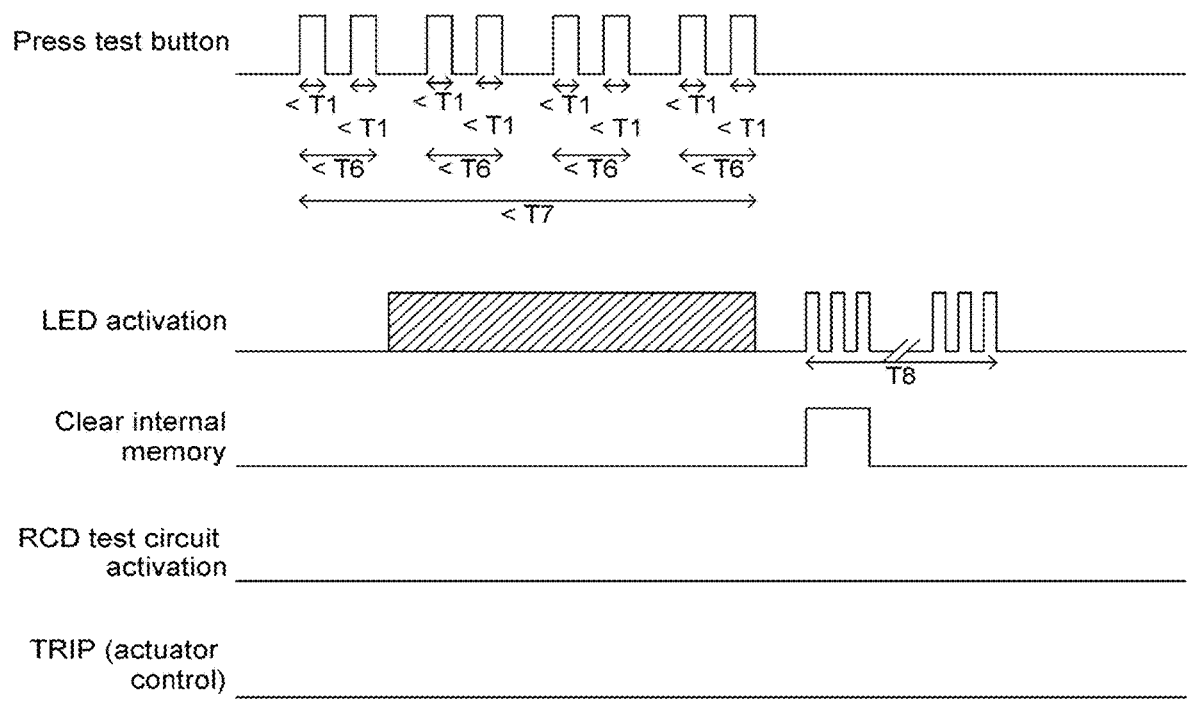

As illustrated in FIG. 9, the apparatus according to this particular implementation furthermore carries out the so-called third function to RESET the internal memory after four short double clicks have been carried out within a temporal window T7, during which temporal window these four sequences of short double clicks are detected in order to launch the particular action of clearing the memory zone in which the history of the trip causes is stored. The two short presses of each double press must be carried out within a temporal window T6. When a first double press is carried out, the sequence for transmitting the item of information through the LED is launched. Each short press will have a maximum duration of T1. After the series of four sequences of double presses carried out within the minimum temporal window T7, an order to clear the internal memory is sent and a sequence of rapid flashes of the LED is activated to signify to the user, when this flashing stops, that the internal memory has been cleared at the end of a duration T8.

It will be noted that all of the numerical duration values given above are given merely by way of indication and by way of example.

It will be noted that, advantageously, the LED may be activated between the two short presses in order for the user to be able to ascertain the state of the product.

It will be noted that, instead of making an LED 7 flash, it is possible to launch the transmission of the item of information via a wireless link. The electrical protection apparatus according to the invention could also comprise means for enabling the user to acknowledge the action requested. Thus, for example, once the microcontroller MCU has detected an action (2 short applications of pressure or else 1 long application of pressure), the LED flashes for a determined duration with two different flashes depending on what the microcontroller MCU has detected, and during this flashing of the LED, the user has to press once on the pushbutton PTT in order to confirm that the action corresponds to what he wants.

This pooling of the action on the test button may be broadened to actions other than the transmission of the last trip cause, such as for example performing a test of the protection VIGI without TRIP. Thus, two short presses would launch an action to test without TRIP, whereas a long press would launch a test with TRIP.

Furthermore, on a type B RCD apparatus, two short presses would launch an AC class test, whereas a long press would launch a DC differential fault detection test, etc.

The invention applies to any electrical protection apparatus equipped with a test button and with decoding intelligence (a microcontroller) in which it is desired to add an on-demand function having added value for the user. It will be noted that a simple electronic board with a microcontroller that is as small as possible may also be added in order to enhance the functionalities of the existing products at a low cost.

Of course, the invention is not limited to the modes of implementation described and illustrated, which have been given only by way of example.

On the contrary, the invention comprises all of the technical equivalents of the means described and combinations thereof provided that these are implemented in accordance with its spirit.

The invention claimed is:

1. An electrical protection apparatus comprising:
a microcontroller configured to carry out at least a first or main electrical protection function;
a test button actuatable by a user to implement testing of at least a second electrical function, the implementation of the test giving rise to tripping of the electrical protection apparatus, wherein
the microcontroller is configured to associate actuation of the test button with at least one action to carry out a third function, as a function of various types of actions exerted on the test button, the actions being detected by the microcontroller, the microcontroller being configured to carry out said third function or the testing of said second function; and
an indicator configured to inform the user of the types of actions exerted on the test button and detected by the microcontroller.

2. The electrical protection apparatus according to claim 1, wherein the first or main electrical function comprises a short-circuit detection function or an electrical overload detection function.

3. The electrical protection apparatus according to claim 1, wherein the second function is one of functions contained in a group comprising a differential protection function, an arc detection function, or a DC differential fault detection function.

4. The electrical protection apparatus according to claim 1, wherein the third function is one of functions contained in a group comprising an item of information transmission action, a function for testing a differential function without tripping, and an AC class test function in case the electrical protection apparatus is a type B RCD.

5. The electrical protection apparatus according to claim 4, wherein said item of information is an item of information on a last trip cause of the electric protection apparatus, which is stored by the microcontroller.

6. The electrical protection apparatus according to claim 4, wherein said item of information is a value of earth leakage current seen by differential protection.

7. The electrical protection apparatus according to claim 4, further comprising an LED or wireless link configured to transmit said item of information.

8. The electrical protection apparatus according to claim 7, wherein said LED is configured to emit an encoded luminous signal, a code of which corresponds to a type of item of information to be transmitted.

9. The electrical protection apparatus according to claim 5, wherein the last trip cause of the electrical protection apparatus, which is stored by the microcontroller, is one of causes contained in a group comprising detection of a differential fault, detection of a series arc, detection of a parallel arc, detection of a fault due to an overvoltage or of a fault originating internally from the electrical protection apparatus.

10. The electrical protection apparatus according to claim 1, wherein the test button is actuatable depending on the various types of actions detected by the microcontroller and exerted on the test button, the various types of actions comprising a long press and/or a short press and/or a double short press, and/or a given number, or a combination, of the presses within a given temporal window.

11. The electrical protection apparatus according to claim 10, wherein
the microcontroller is configured to send, upon the actuation of the test button by the long press, an order to carry out the testing of the second function for a calibrated time, and
the microcontroller is configured to, upon the actuation of the test button by a double short press, carry out the third function.

12. The electrical protection apparatus according to claim 10, wherein the microcontroller is configured to, upon the actuation of the test button by a given number of short double presses within a given temporal window, send a RESET sequence to an internal memory.

13. The electrical protection apparatus according to claim 1, wherein the test button is configured to receive a new actuation from the user to acknowledge the action.

14. The electrical protection apparatus according to claim 13, wherein the indicator is an LED that is configured to flash after the actuation of the test button for a predetermined duration with two different flashes depending on what the microcontroller has detected, the flashes being interruptible during the predetermined duration when the test button receives the new actuation from the user.

15. The electrical protection apparatus according to claim 7, wherein the LED is situated on a front face of the electrical protection apparatus.

16. The electrical protection apparatus according to claim 1, wherein the electrical protection apparatus is a differential circuit breaker comprising an arc detection function.

17. The electrical protection apparatus according to claim 16, further comprising a circuit breaker module associated with a differential protection module incorporating the arc detection function.

* * * * *